(12) United States Patent
Lepape et al.

(10) Patent No.: US 8,245,177 B2
(45) Date of Patent: Aug. 14, 2012

(54) CROSSBAR STRUCTURE WITH MECHANISM FOR GENERATING CONSTANT OUTPUTS

(75) Inventors: Olivier V. Lepape, Paris (FR); Philippe Piquet, Montigny le Bretonneux (FR)

(73) Assignee: Meta Systems, Meudon la Foret (FR)

( * ) Notice: Subject to any disclaimer, the term of this patent is extended or adjusted under 35 U.S.C. 154(b) by 843 days.

(21) Appl. No.: 12/261,912

(22) Filed: Oct. 30, 2008

(65) Prior Publication Data
US 2010/0115483 A1    May 6, 2010

(51) Int. Cl.
    G06F 17/50    (2006.01)
    G06F 13/00    (2006.01)
(52) U.S. Cl. .................. 716/128; 716/126; 710/317
(58) Field of Classification Search .............. 716/126, 716/128; 710/317
    See application file for complete search history.

(56) References Cited

U.S. PATENT DOCUMENTS

| | | | |
|---|---|---|---|
| 7,057,413 B1* | 6/2006 | Young et al. | 326/41 |
| 7,149,996 B1* | 12/2006 | Lysaght et al. | 326/38 |
| 2003/0131331 A1* | 7/2003 | Reblewski et al. | 716/10 |
| 2006/0238223 A1* | 10/2006 | Kuekes et al. | 326/134 |
| 2007/0075737 A1* | 4/2007 | Schmit et al. | 326/41 |
| 2007/0229112 A1* | 10/2007 | Mouttet | 326/39 |
| 2007/0241780 A1* | 10/2007 | Teig et al. | 326/40 |
| 2007/0279089 A1* | 12/2007 | LePape | 326/41 |
| 2008/0180131 A1* | 7/2008 | Teig et al. | 326/46 |

OTHER PUBLICATIONS

Lemieux et al; "Generating Highly-Routable Sparse Crossbars for PLDs"; 2000; Department of Electrical and Computer Engineering, University of Toronto; pp. 155-164.*
Wijetunga, Panduka; "High-performance crossbar design for system-on-chip"; 2003; Department of Electrical Engineering, University of Southern California; pp. 1-6.*

* cited by examiner

*Primary Examiner* — Suresh Memula
(74) *Attorney, Agent, or Firm* — Dickstein Shapiro LLP

(57) ABSTRACT

Embodiments provide crossbar structures, and reconfigurable circuits that contain crossbar structures, that include n inputs and an output, where n is an integer, chains of transistors coupled to the n inputs and the output, a plurality of control signal elements—each coupled to one or more transistors of the plurality of chains of transistors to selectively couple said n inputs to the output—and an additional chain of transistors coupled to at least some of the plurality of control signal elements and the output to selectively couple a constant output voltage to the output. Other embodiments may be disclosed and claimed.

6 Claims, 5 Drawing Sheets

CROSSBAR STRUCTURE WITH MECHANISM FOR GENERATING CONSTANT OUTPUTS

TECHNICAL FIELD

Embodiments relate to the field of integrated circuits; In particular to crossbar devices and their use in reconfigurable circuits.

BACKGROUND

Crossbar devices for programmatically connecting n inputs to m outputs are known in the art. U.S. Pat. No. 6,874,136 describes a crossbar device, and reconfigurable circuits having such a crossbar device. In various embodiments, the crossbar device includes pluralities of chains of pass transistors to selectively couple the input lines to the output lines. Memory elements and decoder logic facilitate the selective coupling. In such a crossbar structure, each of n inputs can be connected to any m outputs, but each of the m outputs can be connected to only one input. Reconfigurable circuits can use such a crossbar circuit to arbitrarily connect fixed and/or programmable logic structures together depending on the desired functionality.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION OF EMBODIMENTS

Figure 1:
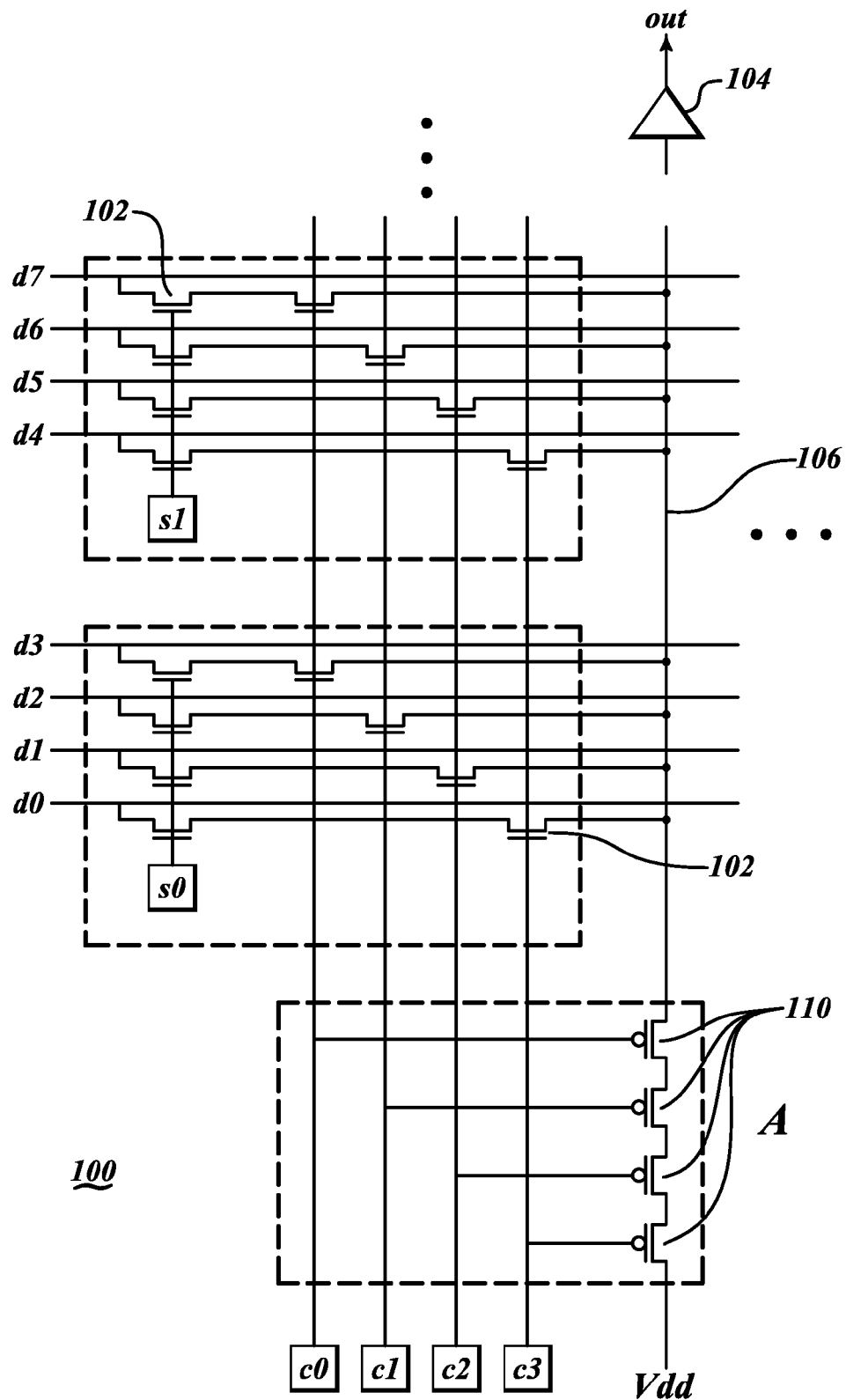
FIG. 1 illustrates a crossbar structure having a mechanism for generating constant outputs in accordance with various embodiments.

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

The description may use perspective-based descriptions such as up/down, back/front, and top/bottom. Such descriptions are merely used to facilitate the discussion and are not intended to restrict the application of embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments, are synonymous.

A crossbar structure according to embodiments may include a mechanism to provide constant output (typically a voltage representing either a logic "1" or "0") when no inputs are selected to be connected to a crossbar output. This may provide an ability to disconnect all inputs from the internal capacitance of the crossbar device as well as provide a constant value as an input to logic functions without taking up computational or routing resources. Control signals that may be used to select the input to be connected to an output may also be used to selectively enable a special chain of transistors, or other component types, connected to the output. This special chain of transistors may also be coupled to a voltage source. When all control signals are set to selectively disable all inputs from the output, each transistor in the special chain of transistors connected to the voltage source may be selectively enabled. This in turn may drive the output to a constant voltage in embodiments.

Crossbar structures according to embodiments may be provided in configurable and/or reconfigurable circuits. Such reconfigurable circuits may be used to program a particular application. Such applications may require constant logic values be provided to logic elements of the reconfigurable circuit. In prior art reconfigurable circuits, providing such constant values requires utilizing computational resources. Embodiments therefore may free up computational resources to perform other useful computational functions besides providing a constant-level voltage or signal.

FIG. 1 illustrates a crossbar structure having a mechanism for generating constant outputs in accordance with various embodiments. Crossbar structure 100 may include a plurality of chains of transistors 102 (such as for example pass transistors) configured to selectively couple any of n inputs labeled as d0 through d7 to output buffer 104. In embodiments, crossbar structure 100 may include a plurality of output buffers each coupled to the same or different inputs. Though only one output buffer is shown in FIG. 1, embodiments are not so limited and crossbar structure 100 is depicted with only one output buffer for ease of illustration. A plurality of control signal elements labeled as S1, S0 and C0 through C3 may be configured to selectively control one or more transistors in the plurality of chains of transistors. For example, when control signal S0 and C1 are set to an enable voltage—and all other control signals set to a disable voltage—input d3 may be selectively coupled to output wire 106. All other inputs may then be—in this example—decoupled from output wire 106. In embodiments, only a single input may be selectively coupled to output buffer 104 at any one time. All other inputs may be either decoupled from any output or coupled to some other output buffer.

In embodiments, crossbar structure 100 may be part of a reconfigurable circuit having a plurality of crossbar structures. In such a reconfigurable circuit according to embodiments, at least one of the crossbar structures may be the same as or similar to crossbar structure 100. Control signal elements may be, in embodiments, a memory cell pre-configured to hold a voltage corresponding to either a logic "1" or a logic "0" depending on the desired cross-coupling. Such programming of the memory cells may occur when reconfigurable circuit 100 is configured or reconfigured.

Crossbar structure 100 may also include circuit A which may include an additional chain of transistors 110. Each transistor in additional chain of transistors 110 may be coupled to one of control signal elements C0-C3. When any of control signal elements C0-C3 are set to an enable voltage—in this example a logic "1"—a corresponding transistor in additional chain of transistors 110 may be disabled. Thus, when crossbar structure 100 is programmed to selectively couple one of n inputs to output buffer 104, additional chain of transistors 110 may be disabled.

If all of control signal elements C0-C3 are set to disable voltages, then each transistor of additional chain of transistors 110 may be configured to be enabled. In such a case, voltage source Vdd may be coupled to output wire 106 and output 104. That is, when crossbar structure 100 is configured to disable all of n inputs to output buffer 104, a constant voltage Vdd may be coupled to output buffer 104. Advantageously, all inputs may be disabled from internal capacitances of crossbar structure 100. Also, a constant output voltage may be coupled to output buffer 104 which may allow a constant input into a logic functionality circuit—either fixed or reconfigurable—such as may be included in a reconfigurable circuit that crossbar structure 100 may be included within. In embodiments, each transistor in additional chain of transistors 110 may be a p-type metal-oxide-semiconductor field effect transistor (pmos transistor). In alternative embodiments, each may be some other type of transistor. In such embodiments, additional logic elements may be included to allow for proper logic functionality.

Embodiments may utilize high-threshold transistors in configuration bit circuits and/or in the additional chain of transistors to reduce leakage current. In embodiments, a supply voltage may be $Vdd+V_{threshold}$ for use in the control signal elements so that the pluralities of chains of pass transistors may be driven to $Vdd+V_{threshold}$ in order to avoid a voltage threshold drop through the chains of transistors. In embodiments, a control signal may be utilized to force all output buffers in a reconfigurable circuit having crossbar structures according to embodiments to a known state on power-on to avoid power consumption in case a random power-on configuration of control signal elements results in short-circuits of output buffers at power-up.

Figure 2:
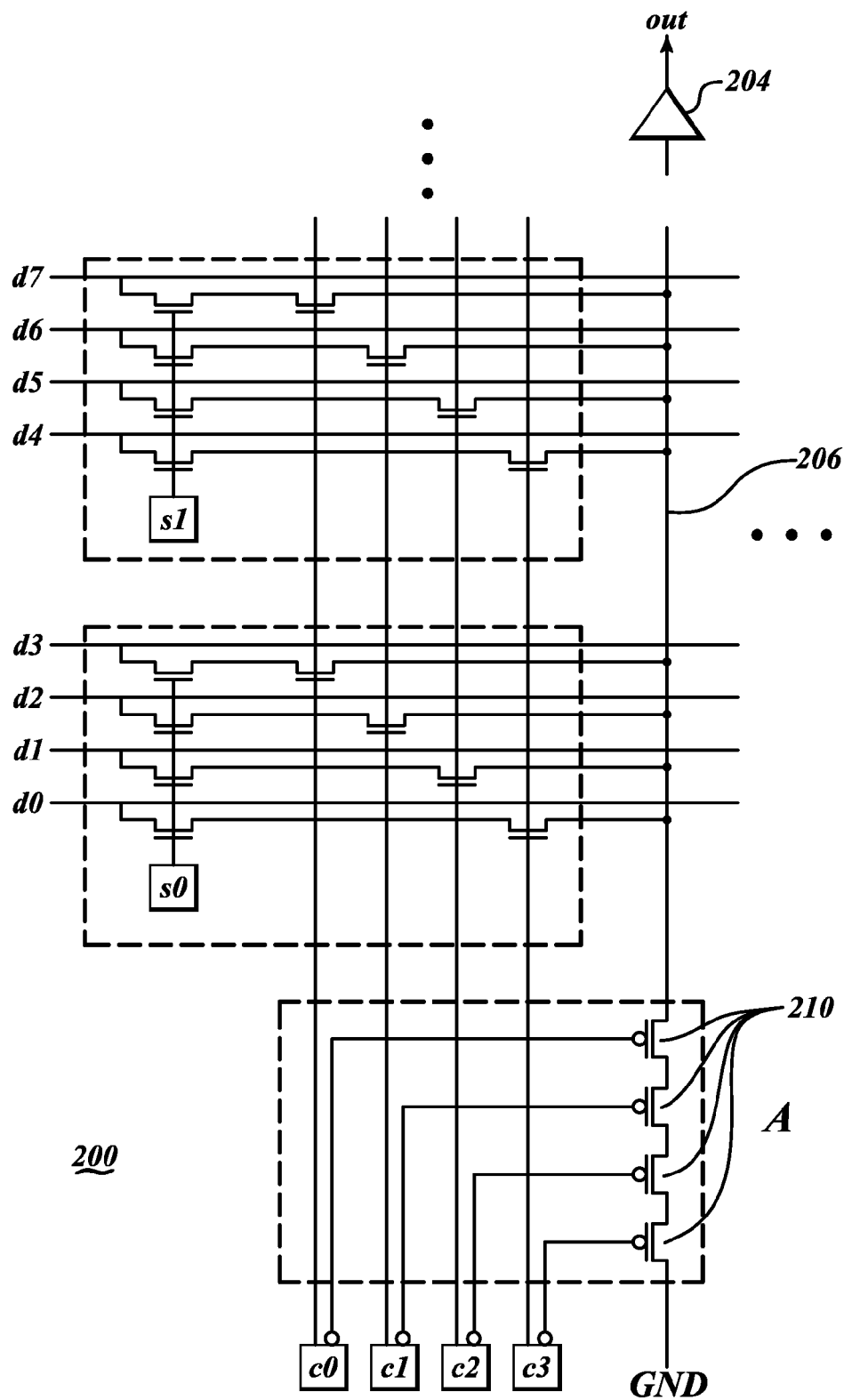
FIG. 2 illustrates a crossbar structure having a mechanism for generating a constant ground-level voltage according to embodiments.

FIG. 2 illustrates a crossbar structure having a mechanism for generating a constant ground-level voltage according to embodiments. Crossbar structure 200 may include circuit A which may include an additional chain of transistors 210 coupled to corresponding ones of control signal elements C0 through C3 through inverting outputs of control signal elements C0 through C3. Similar to circuit A of FIG. 1, additional chain of transistors 210 may be configured to be disabled when any one of control signal elements C0 through C3 is set to an enable voltage for selectively coupling one of n inputs to output buffer 204. Unlike circuit A of FIG. 1, however, when none of control signal elements C0 through C3 are set to an enable voltage, each transistor of additional chain of transistors may be enabled, thereby selectively coupling constant voltage GND (i.e. a ground-level voltage) to output buffer 204 via wire 206. In embodiments, additional chain of transistors 210 may comprise n-type metal-oxide-semiconductor field effect transistors (nmos transistors). This may, in embodiments, allow such transistors to be enabled by the logical inverse of a disabling control signal element voltage and couple a ground-level voltage to wire 206. In embodiments, the remainder of crossbar structure 200 may be configured the same or similarly to crossbar structure 100 of FIG. 1. In this way, crossbar structure 200 may be configured to provide a constant ground-level voltage (e.g. a logic "0") as input to a logical functionality module of a reconfigurable circuit element when none of n inputs is selectively coupled to output buffer 204.

Embodiments may have any number of C control signal elements and a corresponding number of either pmos or nmos transistors in the additional chain of transistors 110 and/or 210. If N inputs are desired, then there may be needed at least k C control signals and N/k S control signals. Circuit delay may not be much affected by the value of k because the size of the pass transistors may not be much affected and each chain of transistors may include only two transistors. Also, the control signal element voltage values may remain constant during crossbar operation. In such embodiments, increasing the number of transistors in the additional chain of transistors may not affect the delay or speed of the circuit. In embodiments, increasing k may cause the unselected inputs to be connected to a small internal capacitance. Also, while for large N, increasing k may decrease the numbers of configuration bits required, increasing k may increase the number of "vertical" traces required in the crossbar structures, as depicted in FIGS. 1 and 2. In embodiments, k may be chosen based on layout constraints and tradeoffs to minimize costs.

In embodiments not depicted in FIGS. 1 and 2, the order of transistors in the chains of transistors selectively coupling the n inputs to the outputs may be arranged or situated in a different order. That is, the transistors coupled to control signal elements S may be between the output buffer and the transistors coupled to control signal elements C which is the opposite of the order depicted in FIGS. 1 and 2. Performance may be affected by the order selected, and it may be advantageous in embodiments to use one order or another.

Figure 3:
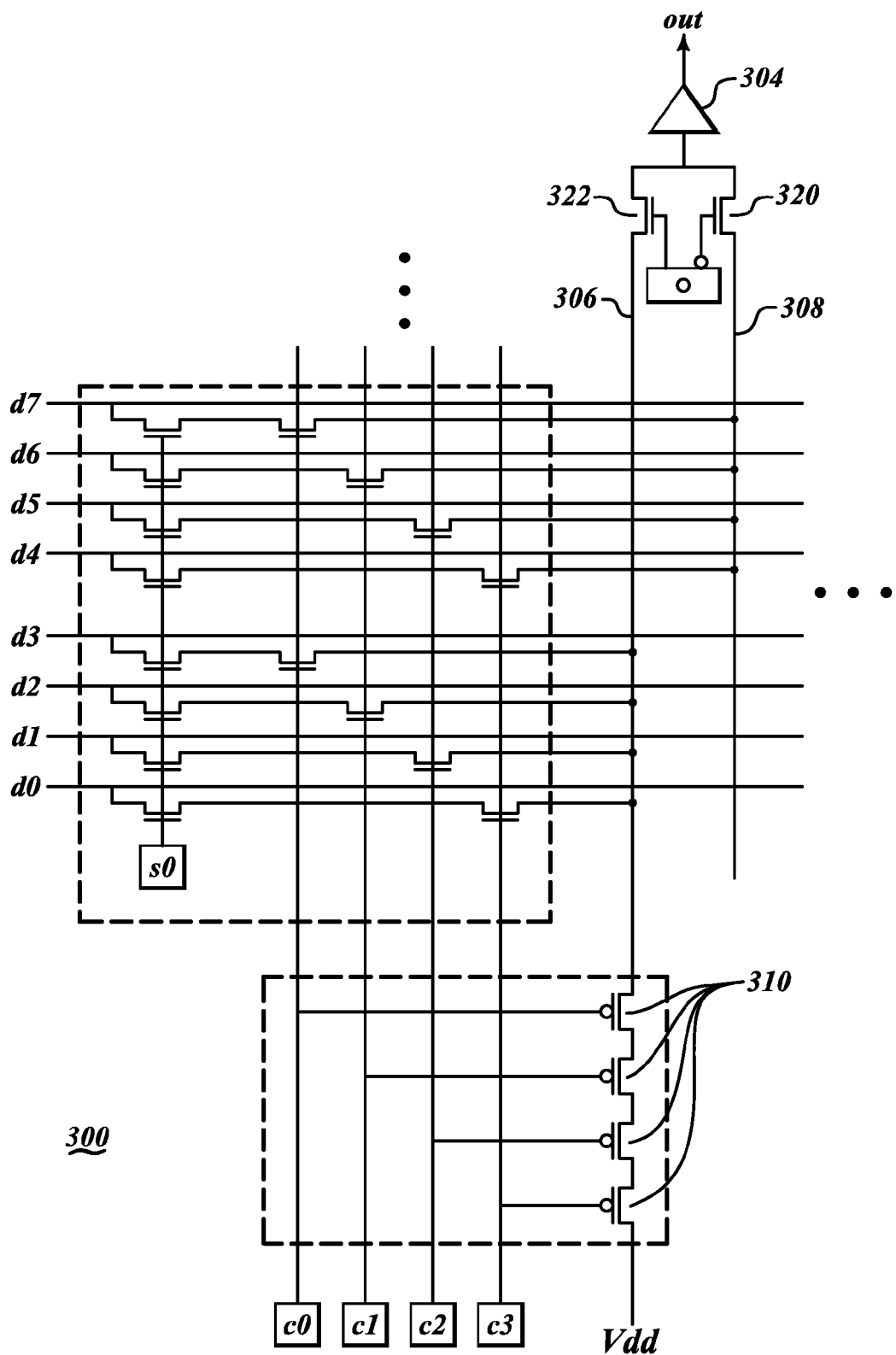
FIG. 3 illustrates a crossbar structure having a mechanism to generate constant outputs and with an additional pass transistor used to select between groups of inputs in accordance with various embodiments.

FIG. 3 illustrates a crossbar structure having a mechanism to generate constant outputs and with an additional pass transistor used to select between groups of inputs in accordance with various embodiments. In addition to control signal elements S and control signal elements C, embodiments may include a control signal element O. Control signal elements S and control signal elements C may have the same or similar function as depicted and described with reference to FIGS. 1 and 2, except that, in embodiments, setting exactly one of control signal elements C and exactly one of control signal elements S may enable two different transistor chains, thereby coupling both to one of internal wires 306 or 308. Control signal element O—which may also in embodiments be implemented as a memory cell programmed when crossbar structure 300 is configured—may be coupled to one of two nmos transistors 320 and 322. Control signal element O may be coupled to nmos transistor 320 via an inverse output. Thus, only one nmos transistors 320 or 322 may be enabled at any one time to couple only one of wires 306 or 308 to output buffer 304. As such crossbar structure 300 may be configured to use control signal elements S, C, and O to selectively couple only one of n inputs to output buffer 304.

When all of control signal elements C are set to a disable voltage, additional chain of transistors 310 may be enabled to couple constant voltage Vdd to wire 306 and to output buffer 304. In embodiments, additional chain of transistors 310 may be coupled to only wire 306, and not wire 308.

In embodiments, there may be more than two internal wires 306 and 308. If j is the number of desired internal common wires, then j O control signal elements may be required to selectively couple one of the j internal wires to output buffer 304. In embodiments, a decoder may be used to perform the selectively coupling; in such embodiments only log(j) O control signal elements may be required to perform the selective coupling. j may be selected to optimize cost and/or delay among other factors.

Figure 4:
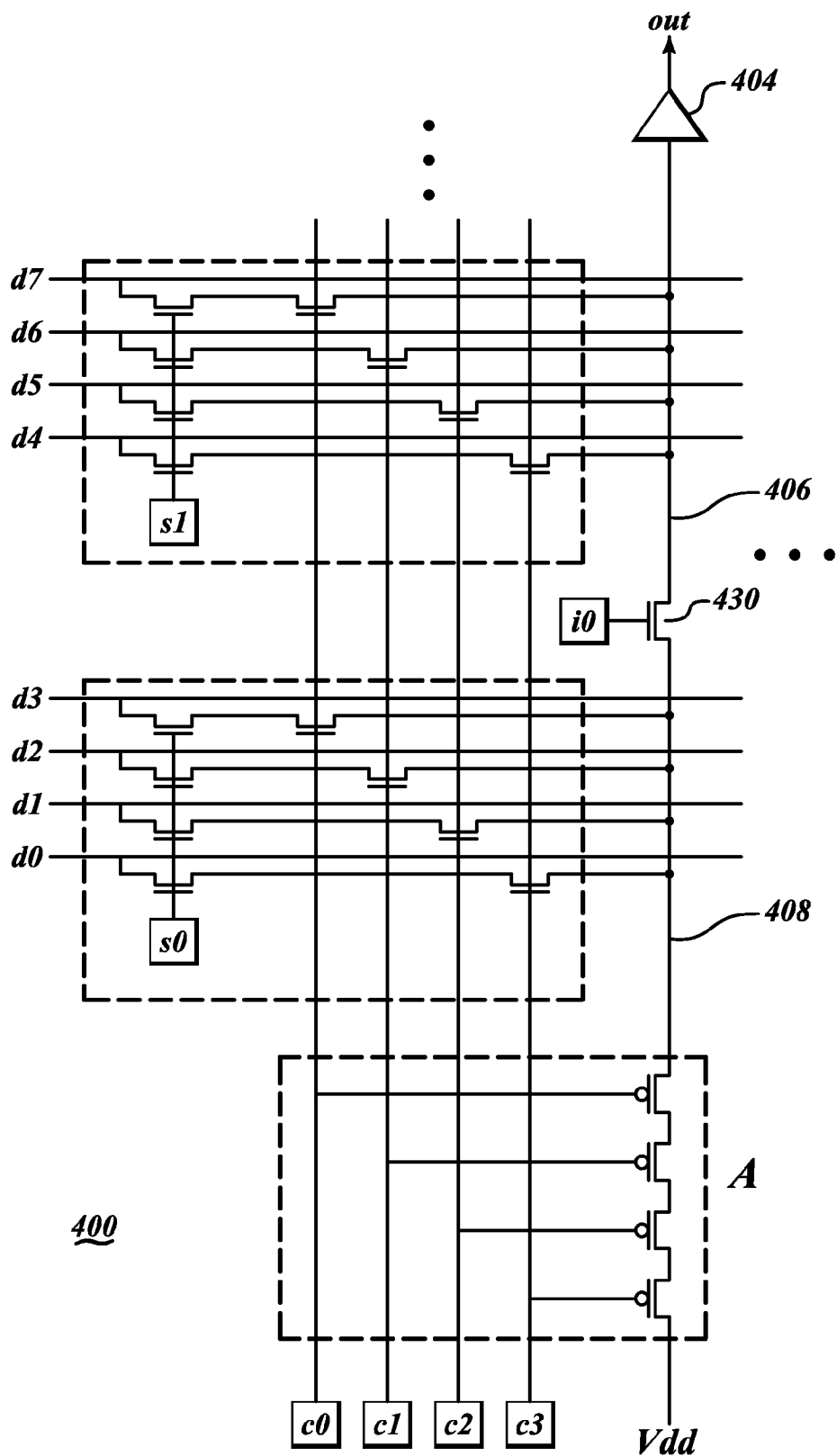
FIG. 4 illustrates a crossbar structure having a mechanism to generate constant outputs and with a structure to make some inputs operate faster in accordance with various embodiments.

FIG. 4 illustrates a crossbar structure having a mechanism to generate constant outputs and with a structure to make a subset of inputs operate faster in accordance with various embodiments. Alternative embodiments may include a structure to make a subset of inputs operate faster but without a mechanism to generate constant outputs. Crossbar structure 400 may include additional pass transistor 430 situated between a first plurality of chains of transistors d0 through d3 and a second plurality of chains of transistors d4 through d7. Additional pass transistor 430 may be coupled to control signal element i0 to selectively couple either the first plurality of chains of transistors or the second plurality of chains transistors to output wire 406. In embodiments, if control signal elements S and C are set to enable the first plurality of chains of transistors to couple one of inputs d4 through d7 to output buffer 404, then control signal element i0 may be set to a disable voltage to isolate the second plurality of chains of transistors. In embodiments, isolating the first plurality of chains of transistors from the second plurality of chains of transistors whenever one of inputs d4 through d7 is selectively coupled to output buffer 404 may reduce the delay of crossbar structure 400 between any of inputs d4 through d7 by significantly reducing the capacitive load on internal wire 406. In other words, isolating the second plurality of chains of transistors from wire 406 may reduce the capacitive load on internal wire 406.

If crossbar structure 400 is configured to enable any of the second plurality of chains of transistors to selectively couple any of inputs d0 through d3 to output buffer 404, then control signal element i0 may be set to an enable voltage to enable additional pass transistor 430 and to couple internal wire 408 to internal wire 406. In embodiments, crossbar structure 400 may be configured to operate the same as, or similarly to, crossbar structure 100 of FIG. 1 except that additional pass transistor 430 may cause additional delay and capacitance to be incurred when it is enabled. Thus, crossbar structure 400 may be configured to provide lower delay when any of inputs d4 through d7 are selectively coupled to output buffer 406 but slower delay when any of inputs d0 through d3 are selectively coupled to output buffer 406.

In embodiments, crossbar structure 400 may be included in a reconfigurable circuit. In such embodiments, faster paths may be selected to implement critical signals in the reconfigurable circuit that determine overall device performance. Non-critical paths may be selected for non-critical signals. In such embodiments, the overall performance of the reconfigurable circuit may be improved over embodiments that do not provide for such division of fast inputs from slow inputs.

In embodiments, control signal i0 may be derived directly from control signals S0 and S1. In such embodiments, the bit stream required to program crossbar structure 400 may not, and need not, include additional bits to program control signal element i0. In alternative embodiments, additional pass transistor 430 may be placed at any point to couple fewer or more of inputs d0 through d7 to internal wire 406. In embodiments, more or fewer inputs may be provided; eight are shown in FIG. 4—and in other figures—for illustrative purposes only.

In embodiments, more additional pass transistors (not shown) similar to additional pass transistor 430 may be included to further divide inputs d0 through d7 into even more isolated segments. In such embodiments, the further away an input is from output buffer 404, the higher the delay may be for such an input. The delay from input to output may generally increase with the number of series transistors. There may therefore be a practical limit to the number of pluralities of chains of pass transistors that can be separated this way.

Figure 5:
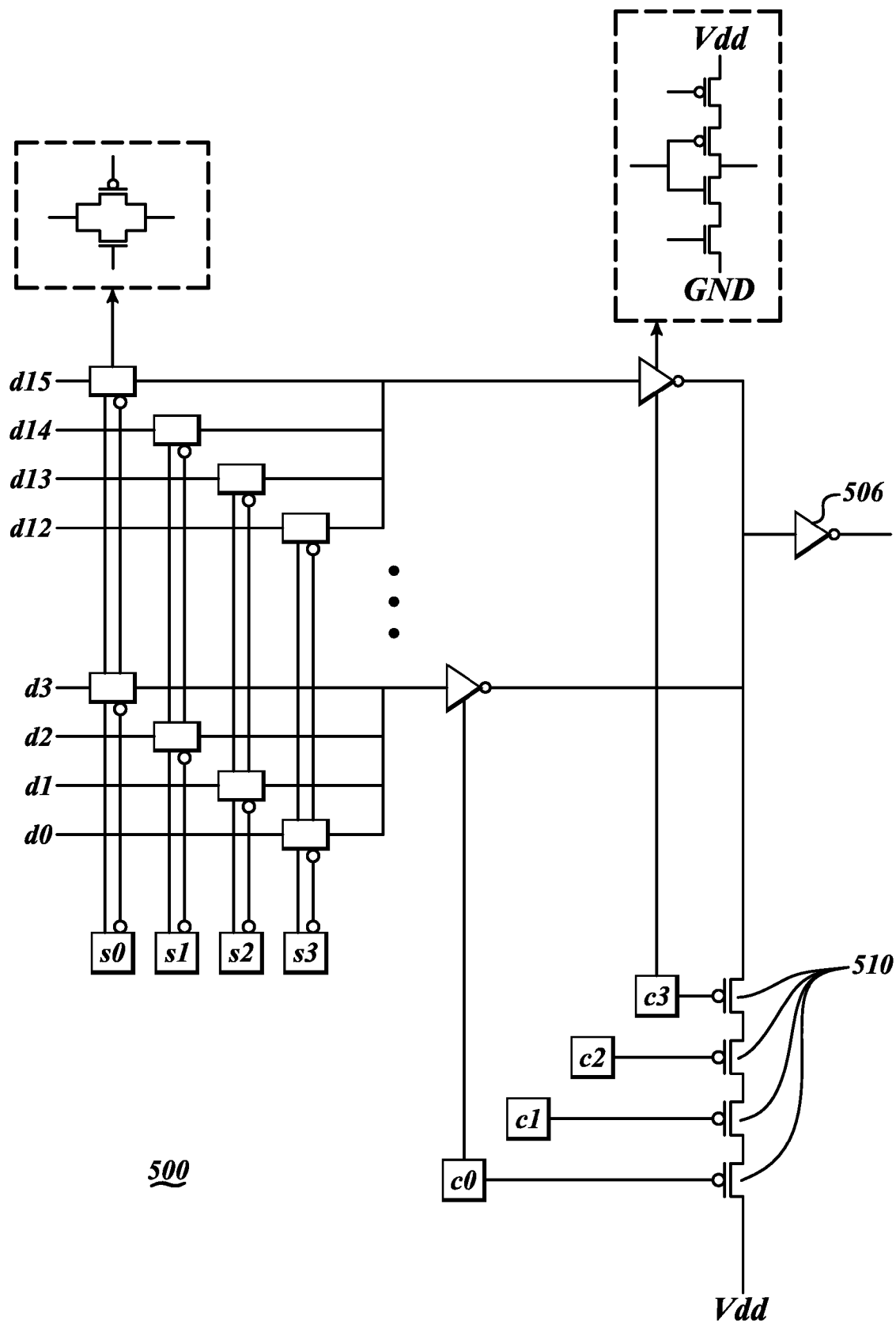
FIG. 5 illustrates a crossbar structure to minimize the skew between inputs and the output in accordance with various embodiments.

FIG. 5 illustrates a crossbar structure to minimize the skew between inputs and the output in accordance with various embodiments. Reducing skew may require maintaining a constant capacitive load no matter which of n inputs is selectively coupled to output buffer 506. In embodiments, crossbar structure 500 may include a plurality of output buffers connected to the n inputs. Though only one output buffer is shown in FIG. 5, embodiments are not so limited. Crossbar structure 500 may include two sections. The first section may be a k-1 multiplexer that may be implemented using transmission gates. The second section may be a second multiplexer having tri-state inverters. An additional chain of transistors 510 may be included within crossbar structure 500 to selectively couple constant voltage VDD to output buffer 506 when none of n inputs are selectively coupled to output buffer 506.

Although certain embodiments have been illustrated and described herein for purposes of description of the preferred embodiment and other embodiments, it will be appreciated by those of ordinary skill in the art that a wide variety of alternate and/or equivalent embodiments or implementations calculated to achieve the same purposes may be substituted for the embodiments shown and described without departing from the scope of the disclosure. Those with skill in the art will readily appreciate that embodiments of the disclosure may be implemented in a very wide variety of ways. This application is intended to cover any adaptations or variations of the embodiments discussed herein. Therefore, it is manifestly intended that embodiments of the disclosure be limited only by the claims and the equivalents thereof.

What is claimed is:
1. A crossbar structure comprising:
n inputs and at least one output, where n is an integer;
a plurality of chains of logic elements coupled to the n inputs and to the at least one output;
a plurality of control signal elements, each coupled to one or more of the plurality of chains of logic elements to selectively couple said n inputs to the output; and a switching circuit coupled to at least one of the plurality of control signal elements, the plurality of chains of logic elements, and the at least one output to divide the plurality of chains of logic elements into a first subset of chains of logic elements and a second subset of chains of logic elements, wherein each of the first and second subsets comprises more than one chain of logic elements.

2. The crossbar structure of claim 1 wherein the switching circuit is configured to selectively couple the first subset of chains of logic elements to the output if the at least one control signal element is at a first level, and to selectively couple the second subset of chains of logic elements to the output if the at least one control signal element is at a second level.

3. The crossbar structure of claim 2 wherein the switching element is configured to isolate the second subset of chains of logic elements from the output if the at least one control signal element is at the first level.

4. The crossbar structure of claim 1 further comprising logic to derive the at least one control signal element from others of the plurality of control signal elements.

5. A crossbar structure comprising:
n inputs and at least one output, where n is an integer;
a plurality of chains of logic elements coupled to the n inputs and to the at least one output;
a plurality of control signal elements, each coupled to one or more of the plurality of chains of logic elements to selectively couple said n inputs to the output;
a switching circuit coupled to at least one of the plurality of control signal elements, the plurality of chains of logic elements, and the at least one output to divide the plurality of chains of logic elements into a first subset of chains of logic elements and a second subset of chains of logic elements; and
an output wire situated between the output and the switching circuit, and wherein the switching circuit comprises an isolation transistor coupled to the output wire to isolate a first subset of the plurality of logic elements from a second plurality of the logic elements when the isolation transistor is disabled.

6. A crossbar structure comprising:
n inputs and at least one output, where n is an integer;
a plurality of chains of logic elements coupled to the n inputs and to the at least one output;
a plurality of control signal elements, each coupled to one or more of the plurality of chains of logic elements to selectively couple said n inputs to the output;
a switching circuit coupled to at least one of the plurality of control signal elements, the plurality of chains of logic elements, and the at least one output to divide the plurality of chains of logic elements into a first subset of chains of logic elements and a second subset of chains of logic elements; and
an output wire, and wherein the switching circuit comprises a first tri-state inverter coupled between the first subset of logic elements and the output wire, and a second tri-state inverter coupled between the second subset of logic elements.

* * * * *